(12) United States Patent
Bradshaw

(10) Patent No.: US 10,324,634 B2
(45) Date of Patent: Jun. 18, 2019

(54) METHODS OF BIT-FLAGGED SKETCH-BASED MEMORY MANAGEMENT AND MEMORY DEVICES UTILIZING THE SAME

(71) Applicant: Micron Technology, Inc., Boise, ID (US)

(72) Inventor: Samuel E. Bradshaw, Sacramento, CA (US)

(73) Assignee: Micron Technology, Inc., Boise, ID (US)

( * ) Notice: Subject to any disclaimer, the term of this patent is extended or adjusted under 35 U.S.C. 154(b) by 102 days.

(21) Appl. No.: 15/482,263

(22) Filed: Apr. 7, 2017

(65) Prior Publication Data

US 2018/0293002 A1 Oct. 11, 2018

(51) Int. Cl.
*G06F 12/02* (2006.01)
*G06F 3/06* (2006.01)
*G06F 11/10* (2006.01)

(52) U.S. Cl.
CPC .......... *G06F 3/0616* (2013.01); *G06F 3/0653* (2013.01); *G06F 3/0673* (2013.01); *G06F 11/1048* (2013.01)

(58) Field of Classification Search
None
See application file for complete search history.

(56) References Cited

U.S. PATENT DOCUMENTS

| | | |
|---|---|---|
| 9,570,159 B1 | 2/2017 | Wakchaure et al. |
| 2007/0204128 A1 | 8/2007 | Lee et al. |
| 2007/0245067 A1 | 10/2007 | Yero |

(Continued)

FOREIGN PATENT DOCUMENTS

| | | |
|---|---|---|
| EP | 2960805 A1 | 12/2015 |
| WO | 2015031051 A1 | 3/2015 |
| WO | 2015183581 A1 | 12/2015 |

OTHER PUBLICATIONS

Charikar, Moses et al., "Finding frequent items in data streams", International colloquium on automata, languages, and programming, Springer Berlin Heidelberg, 2002.

(Continued)

*Primary Examiner* — Charles Rones
*Assistant Examiner* — Ryan Dare
(74) *Attorney, Agent, or Firm* — Perkins Coie LLP

(57) ABSTRACT

A memory device having a memory array and a controller operably coupled to the memory array is described. The controller is configured to store a sketch comprising d rows and w columns, wherein d and w are positive integers. Each row corresponds to a different one of d hash functions. The controller is also configured to detect an event associated with a memory address and to hash the memory address with each of the d hash functions to generate a corresponding d sketch locations. The controller is further configured, for each of the d sketch locations, to set a detection window flag, if it is not already set, and to adjust a stored sketch value by an amount corresponding to the event. The controller is also configured to evaluate a summary metric corresponding to the stored sketch value in each of the d sketch locations to determine if a threshold value has been reached.

12 Claims, 10 Drawing Sheets

(56) References Cited

U.S. PATENT DOCUMENTS

| | | | |
|---|---|---|---|
| 2011/0029571 A1* | 2/2011 | Aggarwal | G06F 17/30958 707/798 |
| 2016/0098201 A1* | 4/2016 | Kim | G06F 11/10 711/103 |
| 2016/0267004 A1 | 9/2016 | Perlstein et al. | |
| 2016/0268000 A1 | 9/2016 | Thompson et al. | |
| 2017/0139626 A1 | 5/2017 | Wakchaure et al. | |

OTHER PUBLICATIONS

Cormode, Graham et al., "An Improved data stream summary: the count-min sketch and its applications", Journal of Algorithms, 55.1, 2005.

Deng, Fan et al., "New estimation algorithms for streaming data: Count-min can do more", http://www.cs.ualberta.ca/fandeng/paper/cmm_full, accessed Feb. 13, 2017.

Dimitropoulos, Xenofontas et al., "The Eternal Sunshine of the Sketch Data Structure", Computer Networks 52.17, 2008.

Fusu, Florin et al., "Statistical analysis of sketch estimators", Proceedings of the 2007 ACM SIGMOD international conference on Management of data. ACM, 2007.

Lai, Yu-Kuen et al., "Implementing on-line sketch-based change detection on a NetFPGA platform", 1st Asia NetFPGA Developers Workshop, 2010.

Morris, Robert et al., "Counting large numbers of events in small registers", Communications of the ACM 21.10, 1978.

International Application No. PCT/US2018/022180—PCT International Search Report and Written Opinion, dated Jun. 22, 2018, 21 pages.

International Application No. PCT/US2018/022188—PCT International Search Report and Written Opinion, dated Jun. 26, 2018, 13 pages.

* cited by examiner

Fig. 2A

|  | COL$_1$ | COL$_2$ | COL$_3$ | COL$_4$ | COL$_5$ | COL$_6$ | COL$_7$ | COL$_8$ | ... | COL$_W$ |
|---|---|---|---|---|---|---|---|---|---|---|
| ROW$_1$ | {0,0} | {0,0} | {0,0} | {0,0} | {0,0} | {0,0} | {0,0} | {0,0} | ... | {0,0} |
| ROW$_2$ | {0,0} | {0,0} | {0,0} | {0,0} | {0,0} | {0,0} | {0,0} | {0,0} | ... | {0,0} |
| ROW$_3$ | {0,0} | {0,0} | {0,0} | {0,0} | {0,0} | {0,0} | {0,0} | {0,0} | ... | {0,0} |
| ROW$_4$ | {0,0} | {0,0} | {0,0} | {0,0} | {0,0} | {0,0} | {0,0} | {0,0} | ... | {0,0} |
| ROW$_5$ | {0,0} | {0,0} | {0,0} | {0,0} | {0,0} | {0,0} | {0,0} | {0,0} | ... | {0,0} |
| ROW$_6$ | {0,0} | {0,0} | {0,0} | {0,0} | {0,0} | {0,0} | {0,0} | {0,0} | ... | {0,0} |
| ROW$_7$ | {0,0} | {0,0} | {0,0} | {0,0} | {0,0} | {0,0} | {0,0} | {0,0} | ... | {0,0} |
| ROW$_8$ | {0,0} | {0,0} | {0,0} | {0,0} | {0,0} | {0,0} | {0,0} | {0,0} | ... | {0,0} |
| ... | ... | ... | ... | ... | ... | ... | ... | ... | ... | {0,0} |
| ROW$_d$ | {0,0} | {0,0} | {0,0} | {0,0} | {0,0} | {0,0} | {0,0} | {0,0} | {0,0} | {0,0} |

Fig. 2B

|  | COL$_1$ | COL$_2$ | COL$_3$ | COL$_4$ | COL$_5$ | COL$_6$ | COL$_7$ | COL$_8$ | ... | COL$_W$ |
|---|---|---|---|---|---|---|---|---|---|---|
| ROW$_1$ | {0,0} | {0,0} | {0,0} | {0,0} | {0,0} | {0,0} | {1,1} | {0,0} | ... | {0,0} |
| ROW$_2$ | {0,0} | {0,0} | {0,0} | {0,0} | {1,1} | {0,0} | {0,0} | {0,0} | ... | {0,0} |
| ROW$_3$ | {0,0} | {1,1} | {0,0} | {0,0} | {0,0} | {0,0} | {0,0} | {0,0} | ... | {0,0} |
| ROW$_4$ | {0,0} | {0,0} | {0,0} | {0,0} | {0,0} | {0,0} | {0,0} | {0,0} | ... | {1,1} |
| ROW$_5$ | {0,0} | {0,0} | {0,0} | {0,0} | {0,0} | {0,0} | {1,1} | {0,0} | ... | {0,0} |
| ROW$_6$ | {0,0} | {0,0} | {0,0} | {1,1} | {0,0} | {0,0} | {0,0} | {0,0} | ... | {0,0} |
| ROW$_7$ | {0,0} | {1,1} | {0,0} | {0,0} | {0,0} | {0,0} | {0,0} | {0,0} | ... | {0,0} |
| ROW$_8$ | {0,0} | {0,0} | {0,0} | {0,0} | {0,0} | {0,0} | {0,0} | {1,1} | ... | {0,0} |
| ... | ... | ... | ... | ... | ... | ... | ... | ... | ... | {0,0} |
| ROW$_d$ | {1,1} | {0,0} | {0,0} | {0,0} | {0,0} | {0,0} | {0,0} | {0,0} | {0,0} | {0,0} |

200 →

|  | COL₁ | COL₂ | COL₃ | COL₄ | COL₅ | COL₆ | COL₇ | COL₈ | ... | COL_W |
|---|---|---|---|---|---|---|---|---|---|---|
| ROW₁ | {0,0} | {0,0} | {0,0} | {1,1} | {0,0} | {0,0} | {1,1} | {0,0} | ... | {0,0} |
| ROW₂ | {0,0} | {0,0} | {0,0} | {0,0} | {1,1} | {0,0} | {1,1} | {0,0} | ... | {0,0} |
| ROW₃ | {0,0} | {1,1} | {0,0} | {0,0} | {0,0} | {1,1} | {0,0} | {0,0} | ... | {0,0} |
| ROW₄ | {0,0} | {0,0} | {0,0} | {0,0} | {0,0} | {0,0} | {0,0} | {1,1} | ... | {1,1} |
| ROW₅ | {0,0} | {0,0} | {0,0} | {0,0} | {0,0} | {0,0} | {1,2} | {0,0} | ... | {0,0} |
| ROW₆ | {0,0} | {0,0} | {1,1} | {1,1} | {0,0} | {0,0} | {0,0} | {0,0} | ... | {0,0} |
| ROW₇ | {0,0} | {1,1} | {0,0} | {0,0} | {0,0} | {0,0} | {0,0} | {0,0} | ... | {1,1} |
| ROW₈ | {0,0} | {0,0} | {0,0} | {0,0} | {0,0} | {0,0} | {0,0} | {1,2} | ... | {0,0} |
| ... | ... | ... | ... | ... | ... | ... | ... | ... | ... | {0,0} |
| ROW_d | {1,1} | {0,0} | {1,1} | {0,0} | {0,0} | {0,0} | {0,0} | {0,0} | ... | {0,0} |

|  | COL₁ | COL₂ | COL₃ | COL₄ | COL₅ | COL₆ | COL₇ | COL₈ | ... | COL_W |
|---|---|---|---|---|---|---|---|---|---|---|
| ROW₁ | {0,0} | {0,0} | {1,4} | {1,3} | {1,3} | {1,3} | {1,5} | {0,0} | ... | {0,0} |
| ROW₂ | {0,0} | {0,0} | {1,4} | {1,3} | {1,4} | {1,2} | {1,5} | {0,0} | ... | {0,0} |
| ROW₃ | {0,0} | {1,3} | {0,0} | {0,0} | {0,0} | {1,3} | {0,0} | {0,0} | ... | {1,2} |
| ROW₄ | {0,0} | {0,0} | {1,2} | {1,4} | {1,5} | {1,4} | {0,0} | {1,4} | ... | {1,3} |
| ROW₅ | {0,0} | {0,0} | {1,3} | {0,0} | {1,1} | {1,3} | {1,4} | {0,0} | ... | {0,0} |
| ROW₆ | {0,0} | {1,3} | {1,3} | {1,3} | {0,0} | {1,4} | {1,4} | {0,0} | ... | {1,4} |
| ROW₇ | {0,0} | {1,3} | {0,0} | {0,0} | {0,0} | {0,0} | {0,0} | {1,5} | ... | {1,3} |
| ROW₈ | {0,0} | {0,0} | {1,5} | {1,3} | {0,0} | {1,3} | {0,0} | {1,5} | ... | {0,0} |
| ... | ... | ... | ... | ... | ... | ... | ... | ... | ... | {1,5} |
| ROW_d | {1,3} | {1,2} | {1,5} | {0,0} | {1,2} | {1,1} | {0,0} | {1,5} | ... | {0,0} |

|      | COL₁ | COL₂ | COL₃ | COL₄ | COL₅ | COL₆ | COL₇ | COL₈ | ⋯ | COL_W |
|---|---|---|---|---|---|---|---|---|---|---|
| ROW₁ | {0,0} | {0,0} | {0,4} | {0,3} | {0,3} | {0,3} | {0,5} | {0,0} | ⋯ | {0,0} |
| ROW₂ | {0,0} | {0,0} | {0,4} | {0,3} | {0,4} | {0,2} | {0,5} | {0,0} | ⋯ | {0,0} |
| ROW₃ | {0,0} | {0,3} | {0,0} | {0,0} | {0,0} | {0,3} | {0,0} | {0,0} | ⋯ | {0,2} |
| ROW₄ | {0,0} | {0,0} | {0,2} | {0,4} | {0,5} | {0,4} | {0,0} | {0,4} | ⋯ | {0,3} |
| ROW₅ | {0,0} | {0,0} | {0,3} | {0,0} | {0,1} | {0,3} | {0,4} | {0,0} | ⋯ | {0,0} |
| ROW₆ | {0,0} | {0,3} | {0,3} | {0,3} | {0,0} | {0,4} | {0,4} | {0,0} | ⋯ | {0,4} |
| ROW₇ | {0,0} | {0,3} | {0,0} | {0,0} | {0,0} | {0,0} | {0,0} | {0,5} | ⋯ | {0,3} |
| ROW₈ | {0,0} | {0,0} | {0,5} | {0,3} | {0,0} | {0,3} | {0,0} | {0,5} | ⋯ | {0,0} |
| ⋯ | ⋯ | ⋯ | ⋯ | ⋯ | ⋯ | ⋯ | ⋯ | ⋯ | ⋯ | {0,5} |
| ROW_d | {0,3} | {0,2} | {0,5} | {0,0} | {0,0} | {0,2} | {0,1} | {0,0} | {0,5} | {0,0} |

|      | COL₁ | COL₂ | COL₃ | COL₄ | COL₅ | COL₆ | COL₇ | COL₈ | ⋯ | COL_W |
|---|---|---|---|---|---|---|---|---|---|---|
| ROW₁ | {0,0} | {0,0} | {0,4} | {0,3} | {0,3} | {0,3} | {1,6} | {0,0} | ⋯ | {0,0} |
| ROW₂ | {0,0} | {0,0} | {0,4} | {0,3} | {1,5} | {0,2} | {0,5} | {0,0} | ⋯ | {0,0} |
| ROW₃ | {0,0} | {1,4} | {0,0} | {0,0} | {0,0} | {0,3} | {0,0} | {0,0} | ⋯ | {0,2} |
| ROW₄ | {0,0} | {0,0} | {0,2} | {0,4} | {0,5} | {0,4} | {0,0} | {0,4} | ⋯ | {1,4} |
| ROW₅ | {0,0} | {0,0} | {0,3} | {0,0} | {0,1} | {0,3} | {1,5} | {0,0} | ⋯ | {0,0} |
| ROW₆ | {0,0} | {0,3} | {0,3} | {1,4} | {0,0} | {0,4} | {0,4} | {0,0} | ⋯ | {0,4} |
| ROW₇ | {0,0} | {1,4} | {0,0} | {0,0} | {0,0} | {0,0} | {0,0} | {0,5} | ⋯ | {0,3} |
| ROW₈ | {0,0} | {0,0} | {0,5} | {0,3} | {0,0} | {0,3} | {0,0} | {1,6} | ⋯ | {0,0} |
| ⋯ | ⋯ | ⋯ | ⋯ | ⋯ | ⋯ | ⋯ | ⋯ | ⋯ | ⋯ | {0,5} |
| ROW_d | {1,4} | {0,2} | {0,5} | {0,0} | {0,0} | {0,2} | {0,1} | {0,0} | {0,5} | {0,0} |

*Fig. 2F*

|  | COL$_1$ | COL$_2$ | COL$_3$ | COL$_4$ | COL$_5$ | COL$_6$ | COL$_7$ | COL$_8$ | ... | COL$_W$ |
|---|---|---|---|---|---|---|---|---|---|---|
| ROW$_1$ | {0,0} | {0,0} | {0,4} | {1,7} | {1,5} | {0,3} | {1,9} | {1,3} | ... | {0,0} |
| ROW$_2$ | {1,4} | {1,5} | {1,9} | {1,7} | {1,8} | {0,2} | {1,8} | {1,1} | ... | {0,0} |
| ROW$_3$ | {0,0} | {1,7} | {1,3} | {0,0} | {0,0} | {1,6} | {0,0} | {1,5} | ... | {0,2} |
| ROW$_4$ | {0,0} | {0,0} | {1,3} | {1,7} | {1,7} | {0,4} | {0,0} | {1,6} | ... | {1,9} |
| ROW$_5$ | {0,0} | {1,2} | {1,8} | {0,0} | {0,1} | {0,3} | {1,10} | {0,0} | ... | {0,0} |
| ROW$_6$ | {0,0} | {0,3} | {0,3} | {1,7} | {0,0} | {1,6} | {0,4} | {0,0} | ... | {1,9} |
| ROW$_7$ | {0,0} | {1,8} | {1,1} | {1,3} | {0,0} | {1,2} | {1,2} | {0,5} | ... | {0,3} |
| ROW$_8$ | {0,0} | {0,0} | {0,5} | {0,3} | {0,0} | {1,4} | {1,3} | {1,9} | ... | {0,0} |
| ... | ... | ... | ... | ... | ... | ... | ... | ... | ... | {1,8} |
| ROW$_d$ | {1,7} | {0,2} | {1,8} | {1,4} | {1,2} | {1,5} | {0,1} | {1,4} | {0,5} | {1,4} |

*Fig. 2G*

|  | COL$_1$ | COL$_2$ | COL$_3$ | COL$_4$ | COL$_5$ | COL$_6$ | COL$_7$ | COL$_8$ | ... | COL$_W$ |
|---|---|---|---|---|---|---|---|---|---|---|
| ROW$_1$ | {0,0} | {0,0} | {0,4} | {1,7} | {1,5} | {0,3} | {1,9} | {1,3} | ... | {0,0} |
| ROW$_2$ | {1,4} | {1,5} | {1,9} | {1,7} | {1,8} | {0,2} | {1,8} | {1,1} | ... | {0,0} |
| ROW$_3$ | {0,0} | {1,7} | {1,3} | {0,0} | {0,0} | {1,6} | {0,0} | {1,5} | ... | {0,2} |
| ROW$_4$ | {0,0} | {0,0} | {1,3} | {1,7} | {1,7} | {0,4} | {0,0} | {1,6} | ... | {1,9} |
| ROW$_5$ | {0,0} | {1,2} | {1,8} | {0,0} | {0,1} | {0,3} | {1,10} | {0,0} | ... | {0,0} |
| ROW$_6$ | {0,0} | {0,3} | {0,3} | {1,7} | {0,0} | {1,6} | {0,4} | {0,0} | ... | {1,9} |
| ROW$_7$ | {0,0} | {1,8} | {1,1} | {1,3} | {0,0} | {1,2} | {1,2} | {0,5} | ... | {0,3} |
| ROW$_8$ | {0,0} | {0,0} | {0,5} | {0,3} | {0,0} | {1,4} | {1,3} | {1,9} | ... | {0,0} |
| ... | ... | ... | ... | ... | ... | ... | ... | ... | ... | {1,8} |
| ROW$_d$ | {1,7} | {0,2} | {1,8} | {1,4} | {1,2} | {1,5} | {0,1} | {1,4} | {0,5} | {1,4} |

| | COL$_1$ | COL$_2$ | COL$_3$ | COL$_4$ | COL$_5$ | COL$_6$ | COL$_7$ | COL$_8$ | ... | COL$_W$ |
|---|---|---|---|---|---|---|---|---|---|---|
| ROW$_1$ | {0,0} | {0,0} | {0,0} | {1,7} | {1,5} | {0,0} | {1,9} | {1,3} | ... | {0,0} |
| ROW$_2$ | {1,4} | {1,5} | {1,9} | {1,7} | {1,8} | {0,0} | {1,8} | {1,1} | ... | {0,0} |
| ROW$_3$ | {0,0} | {1,7} | {1,3} | {0,0} | {0,0} | {1,6} | {0,0} | {1,5} | ... | {0,0} |
| ROW$_4$ | {0,0} | {0,0} | {1,3} | {1,7} | {1,7} | {0,0} | {0,0} | {1,6} | ... | {1,9} |
| ROW$_5$ | {0,0} | {1,2} | {1,8} | {0,0} | {0,0} | {0,0} | {1,10} | {0,0} | ... | {0,0} |
| ROW$_6$ | {0,0} | {0,0} | {0,0} | {1,7} | {0,0} | {1,6} | {0,0} | {0,0} | ... | {1,9} |
| ROW$_7$ | {0,0} | {1,8} | {1,1} | {1,3} | {0,0} | {1,2} | {1,2} | {0,0} | ... | {0,0} |
| ROW$_8$ | {0,0} | {0,0} | {0,0} | {0,0} | {0,0} | {1,4} | {1,3} | {1,9} | ... | {0,0} |
| ... | ... | ... | ... | ... | ... | ... | ... | ... | ... | {1,8} |
| ROW$_d$ | {1,7} | {0,0} | {1,8} | {1,4} | {1,2} | {1,5} | {0,0} | {1,4} | {0,0} | {1,4} |

*Fig. 2I*

METHODS OF BIT-FLAGGED SKETCH-BASED MEMORY MANAGEMENT AND MEMORY DEVICES UTILIZING THE SAME

CROSS-REFERENCE TO RELATED APPLICATION(S)

This application contains subject matter related to an U.S. Patent Application by Samuel E. Bradshaw, entitled "METHODS OF SKETCH-BASED MEMORY MANAGEMENT AND MEMORY DEVICES UTILIZING THE SAME." The related application is assigned to Micron Technology, Inc., and is identified as U.S. application Ser. No. 15/482,288, filed Apr. 7, 2017.

TECHNICAL FIELD

The present disclosure generally relates to semiconductor memory devices, and more particularly relates to methods of bit-flagged sketch-based memory management and memory devices employing the same.

BACKGROUND

Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), resistive random access memory (RRAM), and magnetic random access memory (MRAM), among others.

Different types of memory devices experience different operating characteristics that require different approaches to memory management. For example, memory cells in a flash memory device can only endure a limited number of program and erase operations before the reliability of the memory cells is reduced (e.g., due to a dielectric breakdown causing threshold voltage drift beyond recoverable levels). It may therefore be desirable to track the number of erase and write cycles for memory locations of a non-volatile memory device, together with many other statistics corresponding to the operation of the memory (e.g., occurrence of errors, disturb events, etc.). The amount of storage space required to track multiple statistics for numerous memory locations in a memory device can present a design challenge, as very granular information (e.g., corresponding to the cell and/or page level) for a large memory array can require a significant amount of memory to be set aside for the storage of memory management information.

BRIEF DESCRIPTION OF THE DRAWINGS

FIGS. 2A-2I illustrate a sketch for summarizing information about a memory device at various states in time, in accordance with an embodiment of the present technology.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory devices are not shown, or are not described in detail, to avoid obscuring other aspects of the technology. For example, several functional components of memory devices and/or memory systems that are well-known to those skilled in the art are not discussed in detail below (e.g., circuit components such as multiplexers and decoders, data structures such as address registers and data registers, etc.). In general, it should be understood that various other devices, systems, and methods in addition to those specific embodiments disclosed herein may be within the scope of the present technology.

As discussed above, with memory devices required to track ever more memory management information about ever larger memory arrays, the size and cost of the memory storage for tracking this information continue to increase. Accordingly, several embodiments of memory devices in accordance with the present technology can utilize a sketch to store summarized memory management information, which can reduce the amount of memory storage required to track the information, thereby reducing the design requirements for memory storage on the memory device.

Several embodiments of the present technology are directed to memory devices, systems including memory devices, and methods of operating memory devices. In one embodiment, a memory device comprises a memory array and a controller. The memory array comprises a plurality of memory addresses, and the controller is configured to store summarized information about the plurality of memory addresses in a sketch. For example, the controller can be configured to (a) store a sketch comprising d rows and w columns, wherein d and w are positive integers, and wherein each of the d rows corresponds to a different one of d hash functions, (b) detect, during a detection window, an event associated with a first memory address of the plurality of memory addresses, (c) hash the first memory address with each of the d hash functions to generate a corresponding d sketch locations, (d) set, for each of the d sketch locations, a detection window flag, if the detection window flag is not already set, (e) adjust, for each of the d sketch locations, a stored sketch value by a first amount corresponding to the event, and (f) evaluate a summary metric corresponding to the stored sketch value in each of the d sketch locations to determine if a threshold value has been reached.

Figure 1:
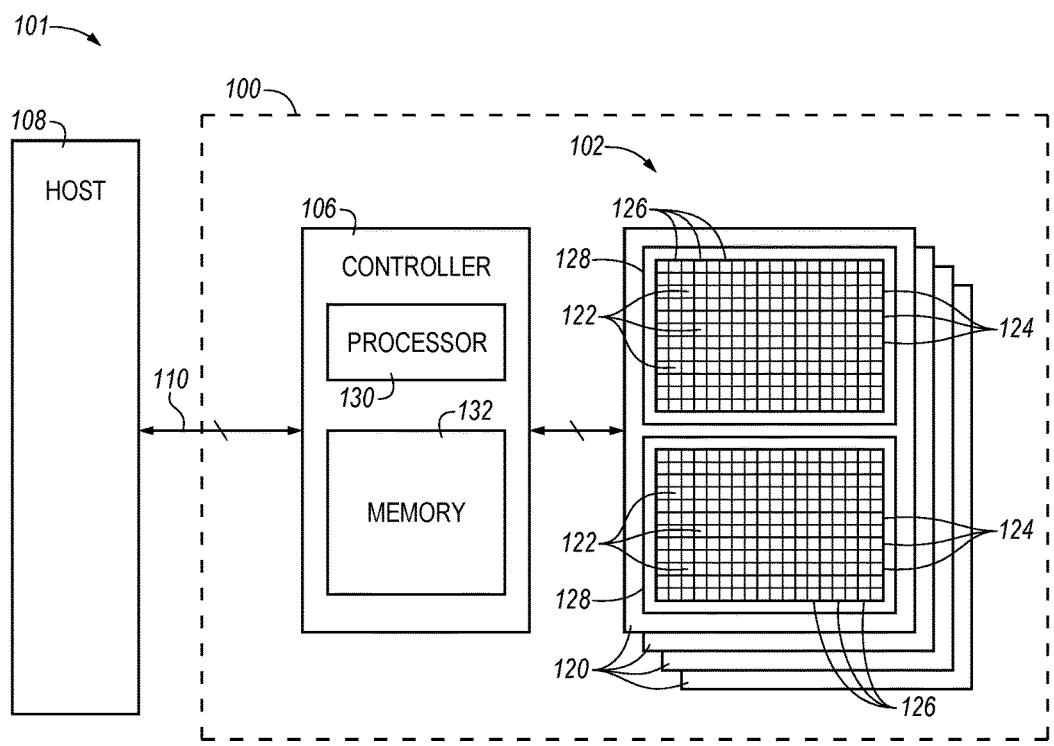
FIG. 1 is a block diagram of a system having a memory device configured in accordance with an embodiment of the present technology.

FIG. 1 is a block diagram of a system 101 having a memory device 100 configured in accordance with an embodiment of the present technology. As shown, the memory device 100 includes a main memory 102 (e.g., NAND flash, NOR flash, chalcogenide PCM, etc.) and a controller 106 operably coupling the main memory 102 to a host device 108 (e.g., an upstream central processor (CPU)). The main memory 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory cells 122 can include, for example, floating gate, charge trap, phase change, ferroelectric, magnetoresitive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line can include one or more memory pages, depending upon the number of data states the memory cells 122 of that word line are configured to store. For example, a single word line of memory cells 122 in which each memory cell 122 is configured to store one of two data states (e.g., SLC memory cells configured to store one bit each) can include a single memory page. Alternatively, a single word line of memory cells 122 in which each memory cell 122 is configured to store one of four data states (e.g., MLC memory cells configured to store two bits each) can include two memory pages. Moreover, memory pages can be interleaved so that a word line comprised of memory cells 122 in which each memory cell 122 is configured to store one of two data states (e.g., SLC memory cells) can span two memory pages, in an "even-odd bit line architecture," where all the memory cells 122 in odd-numbered columns 126 of a single word line are grouped as a first memory page, and all the memory cells 122 in even-numbered columns 126 of the same word line are grouped as a second memory page. When even-odd bit line architecture is utilized in a word line of memory cells 122 in which each memory cell 122 is configured to store larger numbers of data states (e.g., memory cells configured as MLC, TLC, QLC, etc.), the number of memory pages per word line can be even higher (e.g., 4, 6, 8, etc.).

Each column 126 can include a string of series-coupled memory cells 122 connected to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 100 can include only one memory unit 120. Alternatively, memory device 100 can include two, three, four, eight, ten, or more (e.g., 16, 32, 64, or more) memory units 120. Although the memory units 120 are shown in FIG. 1 as including two memory blocks 128 each, in other embodiments, each memory unit 120 can include one, three, four eight, or more (e.g., 16, 32, 64, 100, 128, 256 or more memory blocks). In some embodiments, each memory block 128 can include, e.g., $2^{15}$ memory pages, and each memory page within a block can include, e.g., $2^{12}$ memory cells 122 (e.g., a "4 k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, e.g., memory pointers, fetched data, etc. The embedded memory 132 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 1, memory device 100 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 1).

The controller 106 communicates with the host device 108 over a host-device interface 110. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 108 can be any one of a number of electronic devices capable of utilizing memory for the temporary or persistent storage of information, or a component thereof. For example, host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 108 may be a networking device (e.g., a switch, a router, etc.) or a recorder of digital images, audio and/or video, a vehicle, an appliance, a toy, or any one of a number of other products. In one embodiment, host device 108 may be connected directly to memory device 100, although in other embodiments, host device 108 may be indirectly connected to memory device (e.g., over a networked connection or through intermediary devices).

To effectively manage the operation of memory device 100, many statistics about main memory 102 can be collected, in accordance with one embodiment of the present technology. For example, as NAND flash memory can endure a finite number of program and erase operations before beginning to degrade in reliability, controller 106 (or, e.g., host 108) can collect statistics about the number of times a given memory page of main memory 102 has been programmed and/or a given memory block 128 has been erased. Tracking this information can allow controller 106 (or, e.g., host 108) to more evenly distribute the wear on main memory 102 to prevent the early degradation of a portion thereof. For the more effective management of main memory 102, many other statistics can also be tracked, including information that is cumulative over the lifespan of main memory 102 (e.g., the number of read, program, and/or erase operations for each memory cell, memory page and/or memory block) as well as information that is more transitory (e.g., the number of read errors associated with data currently stored in a particular memory location, a count of read disturb events for a particularly memory location, etc.).

Some types of memory management information that can be used to improve the performance of memory devices are time-dependent statistics (e.g., rates). To calculate the rate at which an event occurs in a memory device, a count of events can be collected over a period of time or a number of operations (e.g., a detection window), and expressed as a rate following the close of the detection window (or even during the detection window). For example, memory devices may employ a multi-tier error-correcting code (ECC) strategy in which memory errors (e.g., read errors) can either be addressed by a lower-strength (e.g., capable of correcting smaller errors) but faster ECC tier or a higher-strength (e.g., capable of correcting larger errors) but slower ECC tier. Such systems can first attempt to address an error with the lower-strength but faster ECC tier, and then only use the higher-strength but slower ECC tier should the attempt with the first ECC tier fail. The rate at which the higher-strength ECC tier is invoked or triggered for a given memory location (e.g., a memory block) can be tracked by the memory device to determine whether a memory block requires some responsive operation (e.g., copy and erase, mark as bad, etc.). Memory devices can track a number of other statistical rates including, but without limitation, read error rates, program error rates, average writes per second, average reads per second, erases per day, and the like.

To cost-effectively store memory management information of these types, a probabilistic, heuristic summary of the information can be used in accordance with one embodiment of the present technology. For example, a sketch is a summary data structure that employs hashing to store summarized information, and that can provide approximate answers to queries about the information while utilizing significantly less space than would be required for non-summarized data. In this regard, utilizing a sketch rather than a table or some other non-summarized method allows for a tradeoff between storage space and estimation accuracy. The estimation error introduced by summarizing memory management information can be bounded to within known values by configuring the sketch to an appropriate size, as is described in greater detail below. Accordingly, utilizing a sketch for storing memory management information can provide sufficient estimation accuracy for the effective management of a memory device while requiring significantly less space than other data structures.

FIG. 2A-2I illustrates a sketch for summarizing information about a memory device, in accordance with one embodiment of the present technology. In FIG. 2A, sketch 200 is illustrated in an initialized state (e.g., before any information about memory device 100 has been stored therein). As can be seen with reference to FIG. 2A, sketch 200 is illustrated as a data array or table with w columns and d rows, where the intersection of each column and row contains a tuple (e.g., a single-bit detection window flag and an integer value). This initialized state of sketch 200 (e.g., where all the tuples have a detection window flag of 0 and an integer value of 0) may correspond to the state of sketch 200 upon first configuring a memory device (e.g., at a time of manufacture), or following the formatting of the memory device.

According to one embodiment of the present technology, sketch 200 may be stored in main memory 102. In another embodiment, sketch 200 may be stored in embedded memory 132 of controller 106. Memory device 100 may utilize multiple sketches for storing multiple statistics about main memory 102 (e.g., error rate, program rate, read rate, etc.), or for storing the same statistic about different portions of main memory 102 (e.g., one sketch per memory die, per memory plane, per memory package, etc.), or some combination thereof. Multiple sketches may be stored in the same location (e.g., all in main memory 102, all in embedded memory 132, all in secondary memory location of the memory device, etc.) or different locations (e.g., one sketch in main memory 102, another sketch in embedded memory 132, another in a different memory location of the memory device), in accordance with yet another embodiment of the present technology.

In accordance with one embodiment of the present technology, in addition to the array of w columns and d rows, sketch 200 also includes a set of d hash functions $h_1 \ldots h_d$ (not illustrated), each corresponding to one of the d rows. In operation, a memory location or address for which information is to be stored (e.g., about an event corresponding to that memory address) is hashed with each of the hash functions to generate, for each row, a particular column in which summarized information is to be stored for that memory address. By selecting the hash functions $h_1 \ldots h_d$ to be independent (e.g., with hash seeds randomly generated, or pre-selected from a list of pairwise independent seeds, etc.), each memory address will have a unique set of sketch locations (e.g., {Row, Col} values) for storing information in the sketch.

For example, FIG. 2B illustrates sketch 200 after having been updated with information about a single event corresponding to a first memory address (e.g., a first memory cell in main memory 102) during a first detection window, in accordance with one embodiment of the present technology. As can be seen with reference to FIG. 2B, sketch 200 has been updated such that one sketch location (highlighted in bold) in each of rows $Row_1$ through $Row_d$ has been updated by setting the detection window flag therein (e.g., the first entry in the tuple) to 1 and by incrementing the value thereof (e.g., the second entry in the tuple) from 0 to 1. The sketch location for each row has been determined by hashing the first memory address with the corresponding hash function for each row. For example, where the first memory address is the address of a particular memory cell, the hash function $h_1$, when hashed with the address of the first memory cell (e.g., an integer number corresponding to the memory cell's location, specifying its memory unit, block, page, etc.) outputs the value 7, such that the sketch location corresponding to hash function $h_1$ is $\{Row_1, Col_7\}$. Similarly, the hash functions $h_2$ through $h_d$, when hashed with the address of the first memory cell, output the values 5, 2, w, 7, 4, 2, 8, . . . 1, respectively. In the present embodiment, each of these sketch locations has been updated by setting the detection window flag (if unset) and by incrementing the previous value of that sketch location upward by one (e.g., indicating the occurrence of one event at the first memory address).

In accordance with one embodiment of the present technology, a benefit of using a sketch to summarize information about a memory device is that the size of the sketch (e.g., w×d) can be much smaller than the number of memory locations for which it stores information (e.g., sub-linear with respect to the number of addresses in the memory device). This benefit comes at the cost, however, of possible data collisions in the sketch, where two memory addresses have overlapping sets of sketch locations for storing information. Although the independence of the hash functions $h_1 \ldots h_d$ reduces the likelihood that two different memory addresses will correspond to the same set of sketch locations to virtually zero, it is possible that at least one sketch location can overlap in the set of sketch locations of two different memory addresses, such that the information in any one particular sketch location (e.g., a $\{Row, Col\}$ pair) can correspond to more than one memory address.

One such collision between two memory addresses is illustrated in FIG. 2C, which illustrates sketch 200 after having been updated with information about another event corresponding to a second memory address (e.g., a second memory cell in main memory 102) during the first detection window, in accordance with one embodiment of the present technology. As can be seen with reference to FIG. 2C, sketch 200 has been updated such that one sketch location (highlighted in bold) in each of rows $Row_1$ through $Row_d$ has been updated by incrementing the value thereof (e.g., the second entry in each tuple) upward by 1, and by setting the detection window flag therein (e.g., the first entry in each tuple) to 1, if not already so set. The location of each sketch location has been selected by hashing the second memory address with each hash function $h_1 \ldots h_d$, as described in greater detail above. More particularly, the hash function $h_1$, when hashed with the address of the second memory cell, outputs the value 4, such that the sketch location corresponding to hash function $h_1$ is $\{Row_1, Col_4\}$. Similarly, the hash functions $h_2$ through $h_d$, when hashed with the address of the second memory cell, output the values 7, 6, 8, 7, 3, w, 8, . . . 3, respectively. In the present embodiment, each of these sketch locations has been updated by setting the detection window flag of that sketch location to 1, if not already set to 1, and by incrementing the previous value of that sketch location upward by one (e.g., indicating the occurrence of one event at the second memory address). In the present embodiment of the technology, hash functions $h_5$ and $h_8$ have output the same sketch locations for the first and second memory cells in corresponding rows $Row_5$ and $Row_8$. Accordingly, the values stored in those sketch locations (e.g., the second element in those tuples) correspond to both the first and second memory address, and are shown to each store the value 2 after this second sketch update.

The impact of a data collision of this nature will depend upon how information about a memory address is retrieved from the sketch. For example, if a lower bound of the number of events that can have occurred at a particular memory address is sought, the sketch locations corresponding to that memory address may be evaluated for their minimum value. In the present embodiment, the minimum value of the sketch locations corresponding to each of the first and second memory locations remains one (e.g., the lowest value stored in the set of sketch locations corresponding to the first memory address is 1, and the lowest value stored in the set of sketch locations corresponding to the second memory address is also 1), indicating that for each of the two memory locations, the type of event summarized in sketch 200 has happened at least once for each of the first and second memory locations. For retrieving information from the sketch in this way, the collision of some sketch locations between the first and second memory addresses can have a negligible impact.

Alternatively, if an upper bound of the number of events that can have occurred at a particular memory address is sought, the sketch locations corresponding to that memory address may be evaluated for their maximum value. In the present embodiment, the maximum value of the sketch locations corresponding to each of the first and second memory locations is now two. For example, in the two sketch locations where the set of sketch locations for these addresses overlap, the highest value stored in the set of sketch locations corresponding to the first memory address is 2 and the highest value stored in the set of sketch locations corresponding to the second memory address is also 2. This indicates that for each of the two memory locations, the type of event summarized in sketch 200 has happened no more than twice for each of the first and second memory locations. For retrieving information from the sketch in this way, the collision of some sketch locations between the first and second memory addresses can have a larger impact (e.g., the estimate is off by 1 from the correct value).

Accordingly, the summary statistic (e.g., a minimum, a maximum, a median, a mean, a mode, a sum, a standard deviation, etc.) utilized to evaluate information in a sketch can be chosen, based upon the type of summarized information stored in the sketch, to reduce the detrimental impact of collisions in accordance with one embodiment of the present technology. For example, if a lower bound for a number of events is desired, the summary statistic may be a minimum value. Alternatively, if an upper bound for a number of events is desired, the summary statistic may be a maximum value. In other embodiments, other summary statistics can also be used, such as median, mode, mean, or even some combination thereof (e.g., the distance between the mean of the set and minimum of the set, or the distance between the maximum and the minimum, etc.).

According to one embodiment of the present technology, the summarized information about a number of events (e.g., program operations, erase operations, read disturb events, errors, etc.) that have occurred at each memory location of a memory device can be used to trigger an operation in response to the number of events exceeding a predetermined threshold. For example, memory device 100 can evaluate a summary statistic (e.g., a minimum, a maximum, a median, a mean, a mode, a sum, a standard deviation, and/or some combination thereof, etc.) for the sketch locations corresponding to a memory address when updating sketch 200 to determine if a responsive operation (e.g., error correction, wear leveling, copy-and-erase, remapping, retirement, etc.) should be performed. FIG. 2D illustrates sketch 200 after multiple subsequent updates have been made to add to sketch 200 information about a number of events occurring at a wide variety of memory addresses (e.g., memory cells in main memory 102) during the first detection window, in accordance with one embodiment of the present technology.

As can be seen with reference to FIG. 2D, sketch 200 has been most recently updated with information corresponding to an event at the first memory address (the sketch locations of which are shown in bolded boxes) such that a minimum value contained in the set of sketch locations for the first memory address (5, 4, 3, 3, 4, 3, 3, 5, . . . , 3) is 3, a maximum for the set is 5, a mean value of the set is 3.67, and a median value of the set is 3. If, in one embodiment of the present technology, the trigger for a responsive operation were that the minimum value in the set of sketch locations is greater than or equal to 3, for example, then the memory device would trigger the performance (e.g., the immediate execution or the scheduling for future execution) of the responsive action. In another embodiment, if the trigger for a responsive operation were that the mean value (or, optionally, the mean value rounded to the nearest integer) in the set of sketch locations is greater than 3.5, then the memory device would trigger the performance of the responsive action.

Although in some embodiments, the information corresponding to memory locations that is summarized in a sketch may only ever increment upwards (e.g., number of program operations, number of erase operations, number of read operations), in other embodiments, the information corresponding to memory locations that is summarized in a sketch may optionally be reduced or reset (e.g., error rate since last block programming, ECC trigger rate since last block erase, etc.). In this regard, the performance of a responsive operation may, in one embodiment, cause an update to the information stored in the sketch for the memory address(es) corresponding to the responsive operation. In this regard, both the stored sketch value may be updated (e.g., reduced by some amount, or reset to zero), and/or the detection window flag may be unset.

For example, if sketch 200 is used to track an ECC trigger rate for each memory block since the last erase operation at that memory block, the responsive action can be a copy and erase operation (e.g., that copies the contents of the triggering block to a second block and erases the triggering block), which can reset the count of ECC trigger events since the last erase operation to 0. In another embodiment, the responsive action can be a remapping of one or more logical addresses with one or more physical addresses associated with the memory block (e.g., to reduce a possible clustering of bit errors by re-ordering the layout of data in multiple physical pages associated with a logical address in order to improve the success rate of a low-latency ECC operation). To reflect that a responsive operation has reduced the relevant metric tracked in sketch 200 for the memory address (e.g., resetting the count of ECC trigger events in that block since the last block erase operation), the sketch locations for that memory address can be updated to reduce the values stored therein (e.g., by a summary statistic amount, or resetting the value to 0), and the detection window flags optionally unset, according to one embodiment of the present technology.

Moreover, in embodiments where a sketch is used to store information about memory locations that may be updated to reflect a responsive operation, the selection of which summary statistic(s) to use to determine whether a responsive operation is warranted, and which summary statistic(s) to use to update the sketch to reflect the performance of a responsive operation, depends upon the desired properties of the estimates provided by the sketch. In some embodiments, the same summary statistic may be used both to determine whether a responsive operation should be performed, and also to update the sketch to indicate the performance of the same. In other embodiments, a different summary statistic may be used to determine whether a responsive operation should be performed from the summary statistic used to update the sketch to indicate the performance of the same. In still other embodiments, values calculated from one or more summary statistics may be used to update a sketch in response to a responsive operation being performed. For example, a sketch could be updated to remove from the values associated with each sketch location corresponding to a memory address a value calculated from a single summary statistic (e.g., MEAN/2 or MIN+1, etc.) or from multiple summary statistics (e.g., MEAN−MIN, MAX−MIN, etc.). Alternatively, in response to a responsive operation being performed, a sketch may be updated with a value not calculated from a summary statistic, but instead determined based on the value at each sketch location (e.g., adjusting each sketch location by a fixed value, reducing each sketch value by half, etc.).

At the close of a detection window (e.g., after a predetermined amount of time, after a predetermined number of operations, in response to a sketch management instruction triggering the close of the detection window in response to a monitored metric), the sketch can be updated to clear transient data in accordance with one embodiment of the present technology. For example, FIG. 2E illustrates sketch 200 after the completion of the first detection window, when sketch 200 has been updated to clear transient data and to reset the detection window flags. In this regard, at the end of a detection window sketch 200 is updated first by clearing all the stored values at memory locations for which the detection window flag was not set (e.g., at which no tracked event occurred during the just-completed detection window), and then by clearing all of the detection window flags for every sketch location. As FIG. 2E illustrates sketch 200 following the close of the first detection window, there are not any sketch locations which still retain values from a previous detection window (and hence there are no values other than 0 in sketch locations for which the detection window flag has not been set). As can be seen with FIG. 2E, however, over the next detection window, the values that were collected in sketch 200 during the first detection window will persist (as only those values associated with an unset detection window flag are cleared at the end of a detection window). In accordance with one embodiment of the subject technology, this process of setting a detection window flag for events detected during the current detection window and then clearing values for sketch locations without a set detection window flag permits a memory device to clear out transient data from the sketch, to prevent the accumulation of counts for transient events (e.g., events that don't occur during multiple sequential detection windows), as will be shown in greater detail below.

Turning to FIG. 2F, sketch 200 is shown following another event at the first memory address (whose sketch locations are again highlighted in bold) in the second detection window, in accordance with one embodiment of the present technology. As can be seen with reference to FIG. 2F, sketch 200 has been updated so that the detection window flag for each sketch location corresponding to the first memory address has been set, and the value at each of those sketch locations has been incremented upwards by one. As more time passes (or events occur) in the second detection window, the values for many other sketch locations are incremented upward, and the detection window flags for other sketch locations corresponding to other memory addresses are set accordingly, as is set forth in greater detail below.

For example, turning to FIG. 2G, sketch 200 is illustrated after multiple subsequent updates have been made to add to sketch 200 information about a number of events occurring at a wide variety of memory addresses (e.g., memory cells in main memory 102) during the second detection window in accordance with one embodiment of the present technology. As can be seen with reference to FIG. 2G, the first memory location (the sketch locations of which remain highlighted in bold) has been updated a number of times during the second detection window, such that a minimum value contained in the set of sketch locations for the first memory address (9, 8, 7, 9, 10, 7, 8, 9, . . . , 7) is 7, a maximum for the set is 10, a mean value of the set is 8.22, and a median value of the set is 8. If, in one embodiment of the present technology, the trigger for a responsive operation were that the minimum value in the set of sketch locations is greater than or equal to 7, for example, then the memory device would trigger the performance of the responsive action. In another embodiment, if the trigger for a responsive operation were that the mean value (or, optionally, the mean value rounded to the nearest integer) in the set of sketch locations is greater than 8, then the memory device would trigger the performance of the responsive action.

The effect of clearing transient information from the sketch at the close of a detection window can now be better illustrated with reference to FIG. 2H, which illustrates sketch 200 in the same state as in FIG. 2G (e.g., after the sketch locations for the first memory address and other addresses have been updated with a number of events during the second detection window), but with the sketch locations for the second memory address now highlighted with bold outlines. Several of the sketch locations corresponding to the second memory address still have, at the completion of the second detection window, unset detection window flags (e.g., {$Row_6$, $Col_3$} and {$Row_7$, $Col_w$}), indicating that no tracked event occurred during the second detection window at the second memory address. Accordingly, when the sketch is updated to clear the values for sketch locations with unset detection window flags, the values in these sketch locations will be set back to 0, such that a MIN summary statistic for the second memory location will correspondingly be 0 (and the MEAN, MEDIAN, and other summary statistics will also be reduced). This data state of sketch 200 is illustrated in FIG. 2I, in which the values for all the sketch locations with unset detection window flags have been reset to 0 (e.g., including {$Row_6$, $Col_3$} and {$Row_7$, $Col_w$}), and the detection window flags for every sketch location subsequently unset.

In this fashion, transient data (e.g., information about events that do not occur in multiple sequential detection windows at a given memory location) can be cleared from a sketch in accordance with one embodiment of the present technology. This process of clearing transient data can therefore prevent false positive determinations that a responsive operation should be performed at a given memory address, which might otherwise occur if the transient data were to slowly accumulate over multiple non-sequential detection windows.

Although in the foregoing embodiments, a single threshold value has been evaluated to determine if a responsive operation should be performed, in still other embodiments, multiple threshold values (e.g., corresponding to different summary statistics) may be evaluated to determine if a responsive operation should be performed. For example, a memory device may be configured to evaluate the sketch locations corresponding to a memory address to determine whether either (1) the minimum value thereof exceeds a first threshold value, or (2) the mean value thereof exceeds a threshold value, and in response to either determination being positive, perform the responsive operation. Moreover, the responsive operation performed may, in some embodiments, depend upon which threshold value triggered the response.

Moreover, although in the foregoing embodiments, the sketch has been described as being updated following a responsive operation to indicate that the responsive operation has been performed, in other embodiments a sketch may not need updating after a responsive operation (e.g., some memory management information may both only increment cumulatively over the life of the memory device, and still be used to trigger a responsive operation). For example, in one embodiment, a memory device may be configured to store in a sketch a total number of write operations for each memory page of the memory device, and may be further configured to mark a page as unreliable after a predetermined number of write operations for the page have been performed (e.g., as determined by evaluating a summary statistic of the information stored in the sketch). For this responsive operation (e.g., marking a page as unreliable), however, no update to the sketch is performed (e.g., the count of cumulative write operations for the page is not reduced in view of marking the page as unreliable).

According to one embodiment of the present technology, a memory device may be configured to update a sketch with information corresponding to an event associated with a memory address, where the information is not merely a count indicating that the event has occurred. For example, where events of different severity or impact can occur at a memory address, the values used to update the sketch locations corresponding to that memory address may differ according to the severity of the event. For example, in a memory device where the number of bit errors per memory page are stored in a sketch, the values used to update sketch locations corresponding to a memory address subject to an error may vary according to the severity of the error (e.g., a "soft" error may increase the values up by a first amount, where a "hard" or uncorrectable error may increase the values by a second amount). The amounts may further vary according to the existing sketch location values (e.g., increasing by one for soft error, doubling the existing sketch value for a hard error). As will be readily understood by those skilled in the art, the foregoing values are merely exemplary, and used to illustrate the principle by which sketch values may be updated according to both the type and severity or impact of an event associated with a memory location or address.

In accordance with various embodiments of the present technology, any one of a number of different types of sketches may be used by memory devices to store summary memory management information. For example, in the foregoing exemplary embodiments, memory devices have been described using FAST-COUNT and COUNT-MIN sketches for storing summary memory management information. In other embodiments, other sketch formats may be utilized in a similar way, including AGMS sketches, FAST AGMS sketches, or the like.

A feature shared by these and other sketches is that they require only sub-linear space, compared to the amount of data that they can be used to summarize. In accordance with one embodiment of the present technology, the amount of space dedicated to a sketch will depend both on the amount of data to be summarized therein and the desired accuracy of the estimates derived therefrom. For example, when a COUNT-MIN sketch of w columns and d rows is used, the size of integers w and d can be selected in view of their relationship to the desired probability of an estimate falling within an estimation error of the correct count of a number of events associated with a memory location. In this regard, the integer w corresponds to an estimation error factor $\varepsilon$ of the sketch according to the equation $w=\lceil e/\varepsilon \rceil$, and the integer d corresponds to an estimation error probability $\delta$ of the sketch according to the equation $d=\lceil \ln 1/\delta \rceil$, such that the likelihood that an estimation of a count of events derived from the COUNT-MIN sketch is within the factor $\varepsilon$ of the correct value with a probability $\delta$.

This relationship of sketch size to accuracy can be better understood with attention to the nature and origin of the collisions described in greater detail above with reference to FIGS. 2A through 2I. Multiple memory addresses (such as the first and second addresses discussed above) may hash to the same sketch location, with a likelihood related to the number of sketch locations in a given row. The larger the number of columns in the sketch, therefore, the lower the likelihood of two memory addresses hashing to the same sketch location in a given row, such that the total number of collisions between two memory addresses is lower. Moreover, the ratio of collisions to sketch locations for a pair of memory addresses (e.g., the percentage of sketch locations for two memory addresses that overlap) can be decreased by increasing the number of rows d, such that the likelihood that a given memory address collides with a large number of other memory addresses across all of its sketch locations is reduced, such that the integer d reduces the probability that the estimate for a given memory address has a large error (e.g., d influences the tail of the error distribution).

Figure 3:
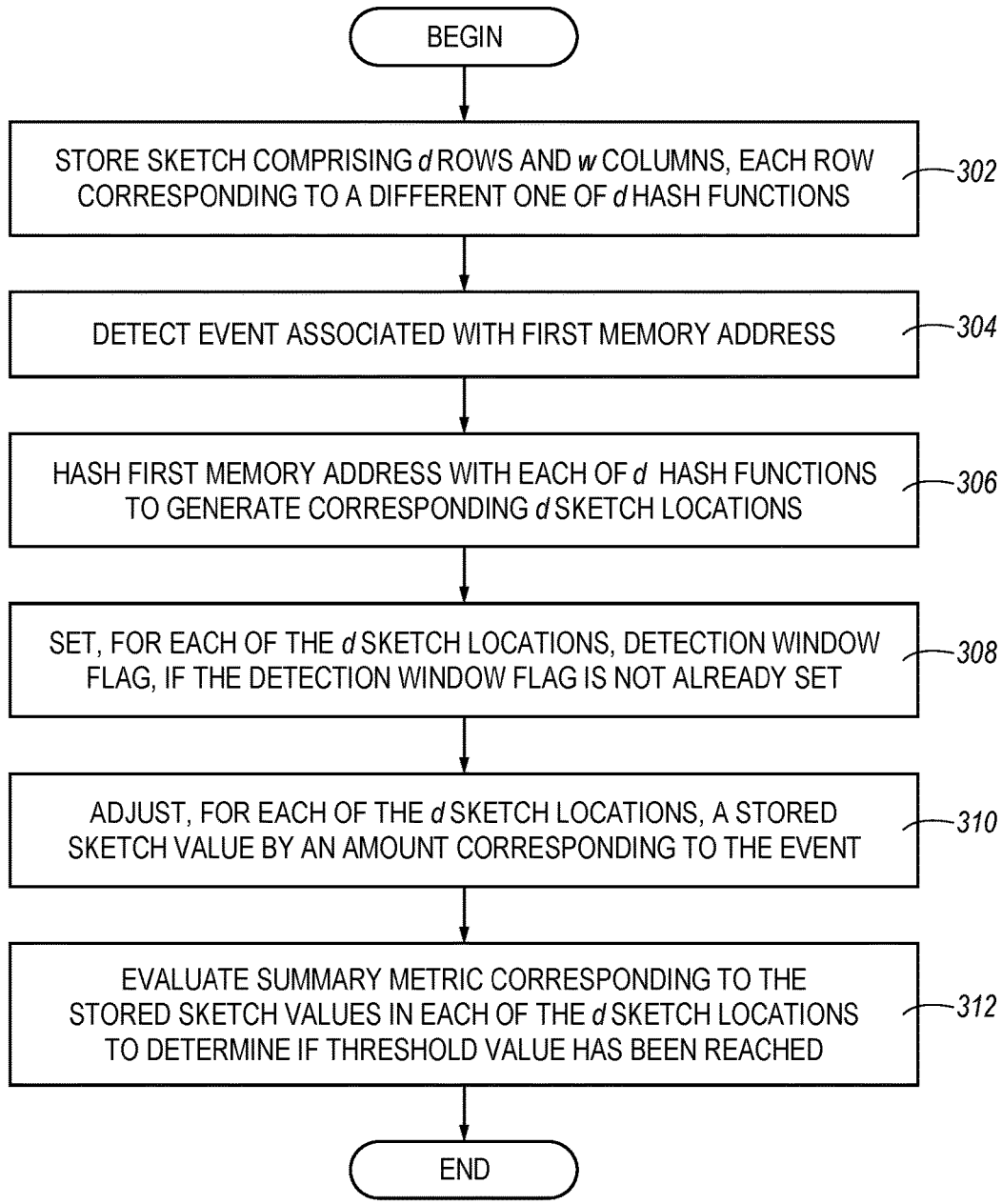
FIG. 3 is a flow chart illustrating a method of operating a memory device in accordance with an embodiment of the present technology.

FIG. 3 is a flow chart illustrating a method of operating a memory device having a memory array in accordance with an embodiment of the present technology. The method begins in step 302, in which a sketch comprising d rows and w columns is stored, wherein d and w are positive integers, and wherein each of the d rows corresponds to a different one of d hash functions. In step 304, the method continues by detecting an event associated with a first memory address of the memory array. In step 306, the first memory address is hashed with each of the d hash functions to generate a corresponding d sketch locations. In step 308, a detection window flag for each of the d sketch locations is set, if the detection window flag is not already set. In step 310, a stored sketch value for each of the d sketch locations is adjusted by a first amount corresponding to the event. In step 312, a summary metric corresponding to the stored sketch value in each of the d sketch locations is evaluated to determine if a threshold value has been reached.

Figure 4:
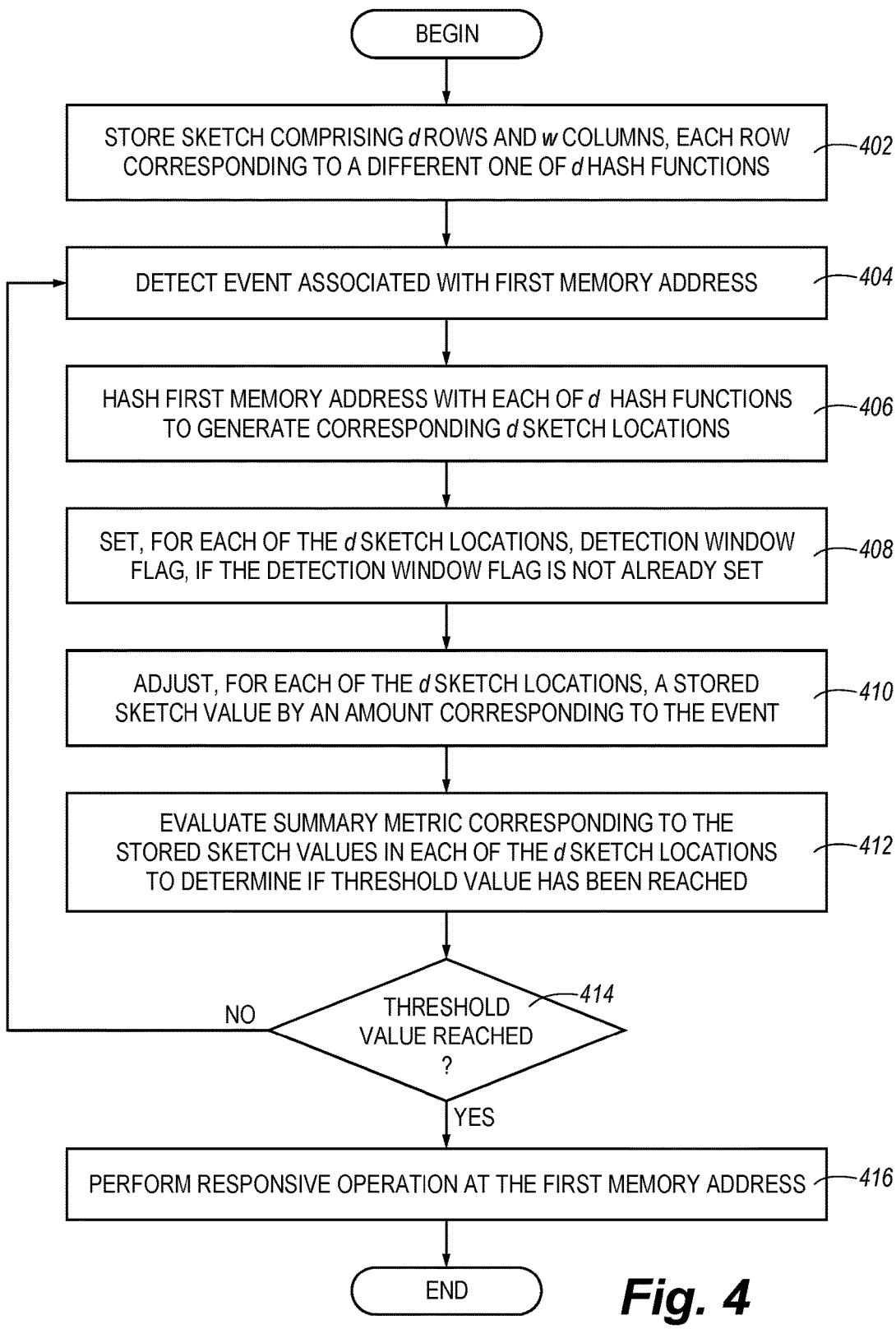
FIG. 4 is a flow chart illustrating a method of operating a memory device in accordance with an embodiment of the present technology.

FIG. 4 is a flow chart illustrating a method of operating a memory device having a memory array in accordance with an embodiment of the present technology. The method begins in step 402, in which a sketch comprising d rows and w columns is stored, wherein d and w are positive integers, and wherein each of the d rows corresponds to a different one of d hash functions. In step 404, the method continues by detecting an event associated with a first memory address of the memory array. In step 406, the first memory address is hashed with each of the d hash functions to generate a corresponding d sketch locations. In step 408, a detection window flag for each of the d sketch locations is set, if the detection window flag is not already set. In one embodiment, step 408 may involve a determination step to determine the status of the flag in the tuple and, based on the determination, to set the flag if it is determined to be unset. In another embodiment, step 408 may simply involve a write operation which writes a value of 1 to the binary flag bit in the tuple, without first determining the current status thereof. In step 410, a stored sketch value for each of the d sketch locations is adjusted by a first amount corresponding to the event. In step 412, a summary metric corresponding to the stored sketch value in each of the d sketch locations is evaluated to determine if a threshold value has been reached. If the threshold value has not been reached, the method returns to step 404, as shown in decision block 414. If, however, the threshold value has been reached, as shown in decision block 414, the method proceeds to step 416, in which a responsive operation is performed at the first memory address.

Figure 5:
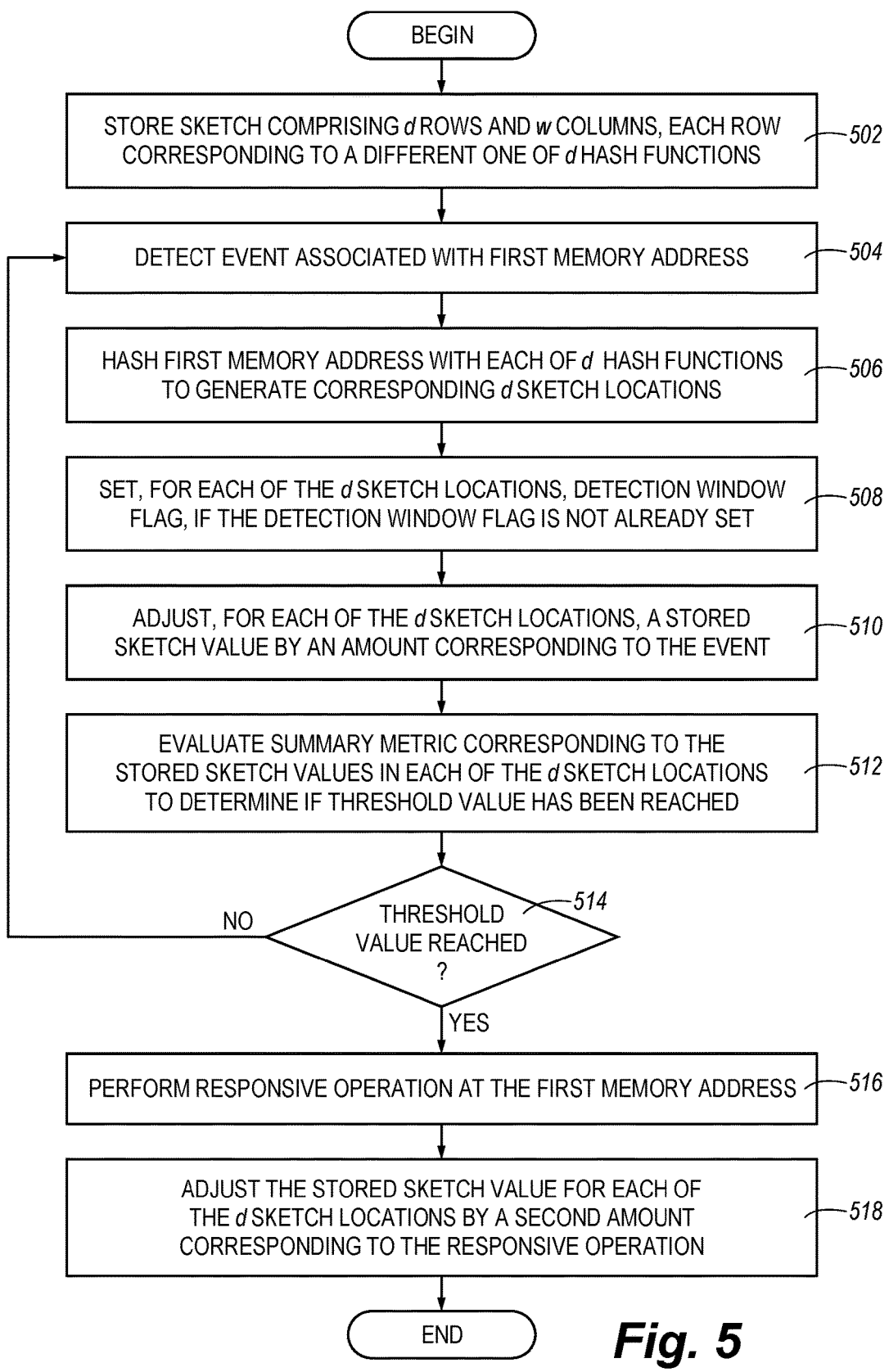
FIG. 5 is a flow chart illustrating a method of operating a memory device in accordance with an embodiment of the present technology.

FIG. 5 is a flow chart illustrating a method of operating a memory device having a memory array in accordance with an embodiment of the present technology. The method begins in step 502, in which a sketch comprising d rows and w columns is stored, wherein d and w are positive integers, and wherein each of the d rows corresponds to a different one of d hash functions. In step 504, the method continues by detecting an event associated with a first memory address of the memory array. In step 506, the first memory address is hashed with each of the d hash functions to generate a corresponding d sketch locations. In step 508, a detection window flag for each of the d sketch locations is set, if the detection window flag is not already set. In one embodiment, step 508 may involve a determination step to determine the status of the flag in the tuple and, based on the determination, to set the flag if it is determined to be unset. In another embodiment, step 508 may simply involve a write operation which writes a value of 1 to the binary flag bit in the tuple, without first determining the current status thereof. In step 510, a stored sketch value for each of the d sketch locations is adjusted by a first amount corresponding to the event. In step 512, a summary metric corresponding to the stored sketch value in each of the d sketch locations is evaluated to determine if a threshold value has been reached. If the threshold value has not been reached, the method returns to step 504, as shown in decision block 514. If, however, the threshold value has been reached, as shown in decision block 514, the method proceeds to step 516, in which a responsive operation is performed at the first memory address. In step 518, the stored sketch value for each of the d sketch locations is adjusted by a second amount corresponding to the responsive operation.

Figure 6:
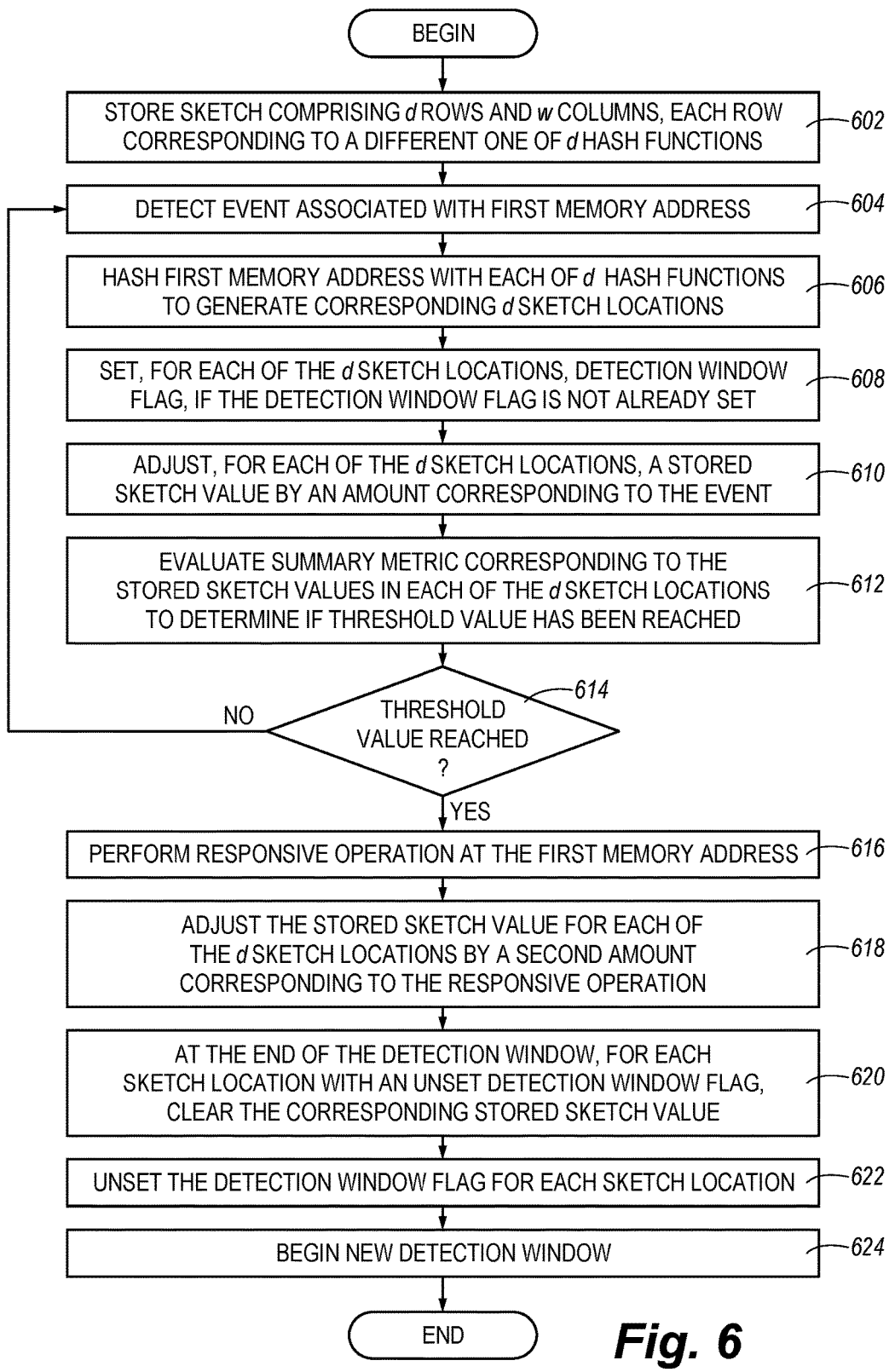
FIG. 6 is a flow chart illustrating a method of operating a memory device in accordance with an embodiment of the present technology.

FIG. 6 is a flow chart illustrating a method of operating a memory device having a memory array in accordance with an embodiment of the present technology. The method begins in step 602, in which a sketch comprising d rows and w columns is stored, wherein d and w are positive integers, and wherein each of the d rows corresponds to a different one of d hash functions. In step 604, the method continues by detecting an event associated with a first memory address of the memory array. In step 606, the first memory address is hashed with each of the d hash functions to generate a corresponding d sketch locations. In step 608, a detection window flag for each of the d sketch locations is set, if the detection window flag is not already set. In one embodiment, step 608 may involve a determination step to determine the status of the flag in the tuple and, based on the determination, to set the flag if it is determined to be unset. In another embodiment, step 608 may simply involve a write operation which writes a value of 1 to the binary flag bit in the tuple, without first determining the current status thereof. In step 610, a stored sketch value for each of the d sketch locations is adjusted by a first amount corresponding to the event. In step 612, a summary metric corresponding to the stored sketch value in each of the d sketch locations is evaluated to determine if a threshold value has been reached. If the threshold value has not been reached, the method returns to step 604, as shown in decision block 614. If, however, the threshold value has been reached, as shown in decision block 614, the method proceeds to step 616, in which a responsive operation is performed at the first memory address. In step 618, the stored sketch value for each of the d sketch locations is adjusted by a second amount corresponding to the responsive operation. In step 620, at the end of the detection window, for each sketch location with an unset detection window flag, the corresponding stored sketch value is cleared. In step 622, the detection window flag for each sketch location is unset. In step 624, a new detection window is begun.

Although in the foregoing exemplary embodiment, the summary statistic corresponding to the stored sketch values for a memory address is checked to determine if a threshold value has been reached before updating the values at the sketch locations with an amount corresponding to the event, in another embodiment, the determination may occur before the sketch locations are so updated, or even in lieu of updating them. For example, to avoid performing two updates to the sketch locations corresponding to the same memory address back-to-back, the evaluation of step 612 may occur prior to the update of step 610, and if a determination is made that the threshold value is exceeded, then step 610 may be omitted, such that a single update (with values that correspond both to the event and the responsive operation) is performed in step 618.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A memory device, comprising:
    a memory array comprising a plurality of memory addresses, and
    a controller operably coupled to the memory array and configured to:
        store a sketch comprising d rows and w columns, wherein d and w are positive integers, and wherein each of the d rows corresponds to a different one of d hash functions,
        detect, during a detection window, an event associated with a first memory address of the plurality of memory addresses,
        hash the first memory address with each of the d hash functions to generate a corresponding d sketch locations,
        set, for each of the d sketch locations, a detection window flag, if the detection window flag is not already set,
        adjust, for each of the d sketch locations, a stored sketch value by a first amount corresponding to the event, and
        evaluate a summary metric corresponding to the stored sketch value in each of the d sketch locations to determine if a threshold value has been reached,
    wherein the integer w corresponds to an estimation error factor $\varepsilon$ of the sketch according to the equation $w = \lceil e/\varepsilon \rceil$, wherein the integer d corresponds to an estimation error probability $\delta$ of the sketch according to the equation $d = \lceil \ln 1/\delta \rceil$, such that an estimation of the sketch is within the factor $\varepsilon$ of a correct value with probability $\delta$.

2. The memory device of claim 1, further comprising a static random access memory (SRAM), and wherein the controller is configured to store the sketch in the SRAM.

3. The memory device of claim 1, wherein the plurality of memory addresses includes a number of memory addresses greater than d×w.

4. The memory device of claim 1, wherein the d sketch locations include one location for each of the d rows.

5. The memory device of claim 1, wherein each of the d hash functions has a unique hash seed.

6. The memory device of claim 1, wherein the summary metric is one of: a minimum value, a maximum value, a median value, or a mean value.

7. The memory device of claim 1, wherein the controller is further configured to:
    perform, if the threshold value has been reached, a responsive operation at the first memory address.

8. The memory device of claim 7, wherein the controller is further configured to:
    adjust, for each of the d sketch locations, the stored sketch value by a second amount corresponding to the responsive operation.

9. The memory device of claim 1, wherein the controller is further configured to:
    clear, at the end of the detection window, for each sketch location with an unset detection window flag, the corresponding stored sketch value, and
    unset, at the end of the detection window, the detection window flag for each sketch location.

10. The memory device of claim 9, wherein the controller is further configured to:
    begin a new detection window.

11. The memory device of claim 1, wherein the event is one of: a program operation, an erase operation, a read operation, a disturb event, or an error.

12. The memory device of claim 1, wherein the sketch is one of: a COUNT sketch, a COUNT-MIN sketch, an AGMS sketch, and a FAST AGMS.

* * * * *